United States Patent
Tsukikawa

[19]

[11] Patent Number: 6,061,285
[45] Date of Patent: May 9, 2000

[54] SEMICONDUCTOR MEMORY DEVICE CAPABLE OF EXECUTING EARLIER COMMAND OPERATION IN TEST MODE

[75] Inventor: Yasuhiko Tsukikawa, Hyogo, Japan

[73] Assignee: Mitsubishi Denki Kabushiki Kaisha, Tokyo, Japan

[21] Appl. No.: 09/437,729

[22] Filed: Nov. 10, 1999

[51] Int. Cl.[7] .................................................. G11C 29/00
[52] U.S. Cl. .......................................... 365/201; 365/203
[58] Field of Search .................................. 365/201, 203, 365/189.01

[56] References Cited

U.S. PATENT DOCUMENTS

| | | |
|---|---|---|
| 4,608,669 | 8/1986 | Klara et al. |
| 5,610,867 | 3/1997 | DeBrosse et al. .................... 365/201 |
| 5,619,460 | 4/1997 | Kirihata et al. ...................... 365/201 |

FOREIGN PATENT DOCUMENTS

| | | |
|---|---|---|
| 60-103576 | 6/1985 | Japan . |
| 60-245275 | 12/1985 | Japan . |
| 4-28085 | 1/1992 | Japan . |

*Primary Examiner*—Vu A. Le
*Attorney, Agent, or Firm*—McDermott, Will & Emery

[57] ABSTRACT

An SDRAM includes a test precharge signal generator which is activated in response to a test mode signal from a test mode detector. The test precharge signal generator generates a test precharge signal before generation of a precharge signal by a command decoder in response to a write signal from the command decoder. Therefore, in the wafer test using a clock signal having low frequency, it becomes possible to execute precharging operation before the input of the normal precharge command after the input of the write command. As a result, it becomes possible to replace a memory cell, which has low power in terms of write recovery time period, by a redundant memory cell in the wafer test, and to improve production yield.

11 Claims, 6 Drawing Sheets

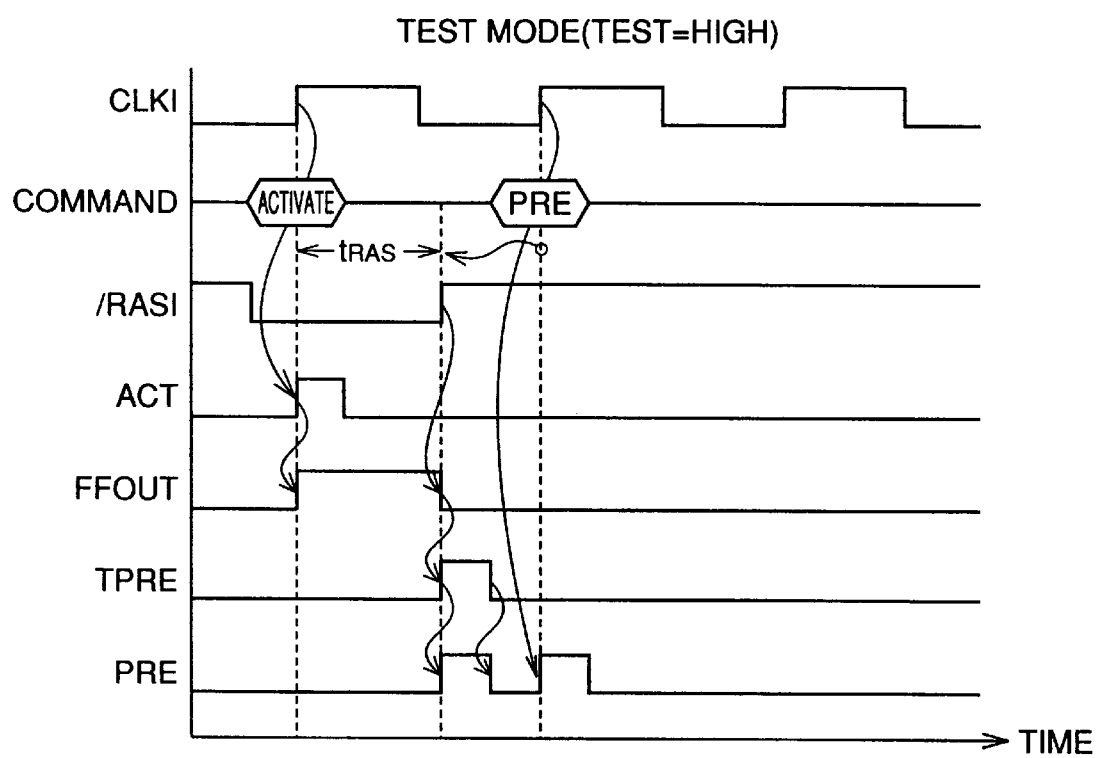

SEMICONDUCTOR MEMORY DEVICE CAPABLE OF EXECUTING EARLIER COMMAND OPERATION IN TEST MODE

BACKGROUND OF THE INVENTION

1. Field of the Invention

The present invention relates to a semiconductor memory device, and more specifically, to a synchronous semiconductor memory device capable of executing a command operation prior to an input of the command in a test mode.

2. Description of the Background Art

A synchronous dynamic random access memory device hereinafter referred to as "SDRAM") performing reading and writing operations in synchronization with an externally applied clock signal has been provided as one of semiconductor memory devices.

Generally, the SDRAM operates in accordance with an externally applied command. The command includes an activation command for activating a word line, a precharge command for inactivating the word line, a read command for reading data while the word line is activated, and a write command for writing data while the word line is activated. For inputting these commands, a chip select signal, a row address strobe signal, a column address strobe signal, a write enable signal, an address signal and a data signal are used.

A time period from the start of a write operation to a precharging operation is referred to as "write recovery time $t_{WR}$", which time period is critical in the operation of the SDRAM.

In order to write data to the SDRAM, the activation command, write command and precharge command are applied successively. When the applied activation command is input in synchronization with the clock signal, the word line is activated, whereby charges which have been accumulated in a memory cell are discharged to a bit line, resulting in potential difference between a pair of bit lines. The potential difference is amplified by a sense amplifier, and original data is restored in the memory cell.

Thereafter, when the applied write command is input in synchronization with the clock signal, a column selection line is activated and thus the data of an input/output line is transmitted to the bit line pair. When the data of the input/output line pair is of a logic opposite to that of the data on the bit line pair, a write driver driving the input/output line pair inverts the data stored in the sense amplifier, thereby inverting the data on the bit line pair as well. Therefore, when the driving ability of the input/output line pair is increased, it becomes possible to quickly inverse the data on the bit line pair.

Simple inversion of the data on the bit line pair does not complete the writing operation. In order to complete the writing operation, it is necessary to transmit voltage of the inverted bit line to a capacitor through an access transistor in the memory cell. In an integrated SDRAM, however, impedance of the access transistor cannot be very much decreased. Further, there is a variation in the impedance of the access transistors, resulting in time difference in transmitting the voltage from the bit line to the capacitor among memory cells.

When the precharge command is applied following the write command, the word line is inactivated, whereby transmission of the voltage from the bit line to the capacitor is completed. As described above, among access transistors, some may have high impedance, and in such a memory cell having high impedance, the voltage of the capacitor cannot reach the full power supply voltage, and the writing operation ends before the original data is sufficiently restored. In such a memory cell, charge accumulation is insufficient, and therefore, when the active command is applied next, the data read to the bit line pair cannot be correctly amplified by the sense amplifier, resulting in a malfunction.

A memory cell which is prone to the possibility of malfunction is found by a test and replaced by a normal redundant memory cell. Such replacing operation is generally performed in the state of a wafer, after the end of wafer processing and before mold assembly. This operation is referred to as wafer test. In the wafer test, the wafer is directly subjected to probing and tested, and therefore it is difficult to operate the chip in the state of a wafer at the same frequency as the actual clock frequency. Clock frequency for a typical SDRAM is about 100 MHz, whereas clock frequency for the wafer test is about 20 MHz. When the SDRAM is actually operated, write recovery time $t_{WR}$ of about 10 ns is required, while in the wafer test, only the time period of down to 50 ns can be set. Therefore, a memory cell of which effective value of write recovery time $t_{WR}$ is from 10 to 50 ns cannot be repaired by the wafer test, and as a result, such an SDRAM would be found defective in a shipment test which is performed under the same clock frequency of 100 MHz as in the actual use.

SUMMARY OF THE INVENTION

An object of the present invention is to provide a semiconductor memory device with high protection yield.

Another object of the present invention is to provide a semiconductor memory device in which almost all defective memory cells can be found even when tested at a clock frequency lower than in the actual use.

The present invention provides a semiconductor memory device having a normal mode and a test mode, including a memory cell array, a command decoder, a data write/read circuit and an early activation circuit. The command decoder decodes a first command consisting of a first combination of a plurality of external signals and a second command consisting of a second combination of the plurality of external signals and applied after the first command, and generates first and second command signals. Data write/read circuit is coupled to the memory cell array, and executes first and second command operations in response to the first and second command signals for writing data to the memory cell array and reading data from the memory cell array. The early activation circuit is coupled to the command decoder and the data write/read circuit, and in the test mode, activates the second command signal which is to be applied to the data write/read circuit from the command decoder, before generation of the second command signal by the command decoder, in response to the first command signal.

When the semiconductor memory device is in the normal mode, the command decoder generates the first command signal in accordance with the first command, and in response to the first command signal, the data write/read circuit executes the first command operation. Thereafter, the command decoder generates the second command signal in accordance with the second command, and in response to the second command signal, the data write/read circuit executes the second command operation.

When the semiconductor memory device is in the test mode, the command decoder generates the first command signal in accordance with the first command, and in response to the first command signal, data write/read circuit executes the first command operation. Thereafter, before the command decoder generates the second command signal in accordance with the second command, the early activation circuit activates the second command signal. Therefore, before the application of the second command, the data write/read circuit executes the second command operation in response to the thus activated second command signal.

Therefore, an advantage of the present invention is that the time period from the first command operation to the second command operation is intentionally shortened so as to reveal any defects caused thereby.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a timing chart representing an operation of the test precharge signal generator shown in FIG. 8.

DESCRIPTION OF THE PREFERRED EMBODIMENTS

Figure 1:
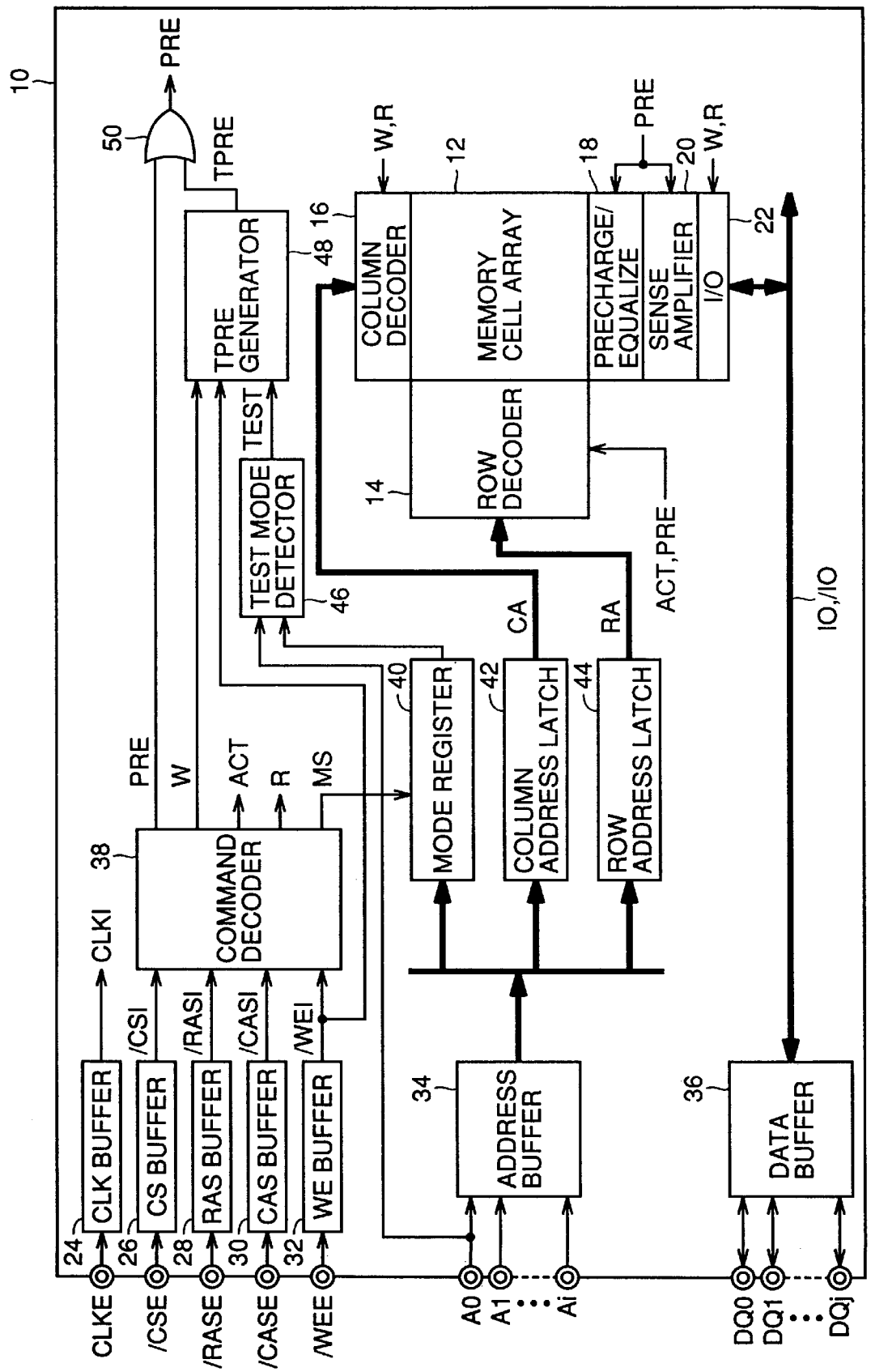
FIG. 1 is a block diagram representing an overall configuration of the SDRAM in accordance with an embodiment of the present invention.

Embodiments of the present invention will be described in detail with reference to the figures. In the figures, corresponding portions are denoted by the same reference characters, and description thereof is not repeated.

First Embodiment

Referring to FIG. 1, an SDRAM 10 includes: a memory cell array 12; a row decoder 14 selecting a row of memory cell array 12 in response to a row address signal RA; a column decoder 16 selecting a column of memory cell array 12 in response to a column address signal CA; a precharge/equalize circuit 18 performing precharge and equalize operation for memory cell array 12; a sense amplifier circuit 20 amplifying data signal read from memory cell array 12; and an input/output circuit 22 inputting data to memory cell array 12 and outputting data from memory cell array 12.

The SDRAM 10 includes: a clock buffer 24 generating an internal clock signal CLKI in response to an external clock signal CLKE; a chip select buffer 26 generating an internal chip select signal /CSI in response to an external chip select signal /CSE; a row address strobe buffer 28 generating an internal row address strobe signal /RASI in response to an external row address strobe signal /RASE; a column address strobe buffer 30 generating an internal column address strobe signal /CASI in response to an external column address strobe signal /CASE; and a write enable buffer 32 generating an internal write enable signal /WEI in response to an external write enable signal /WEE.

The SDRAM further includes an address buffer 34 receiving as inputs address signals A0, A1 . . . , Ai, and a data buffer 36 inputting and outputting data signals DQ0, DQ1, . . . , DQj.

The SDRAM 10 further includes a command decoder 38 decoding a command consisting of a combination of these external control signals ICSE, /RASE, /CASE and /WEE, and hence the combination of internal control signals /CASI, /RASI, /CASI and /WEI, and generating command signals ACT, W, R, PRE and MS. More specifically, when internal chip select signal CSI is at an L (logic low) level, internal row address strobe signal /RASI is at the L level, internal column address strobe signal /CASI is at an H logic high) level and internal write enable signal /WEI is at the H level, the activation signal ACT is generated. When internal chip select signal /CSI is at the L level, internal row address strobe signal /RASI is at the H level, internal column address strobe signal /CASI is at the L level and internal write enable signal /WEI is at the L level, the write signal W is generated. When internal chip select signal /CSI is at the L level, internal row address strobe signal /RASI is at the H level, internal column address strobe signal /CASI is at the L level and internal write enable signal /WEI is at the H level, the read signal R is generated. When internal chip select signal /CSI is at the L level, internal row address strobe signal /RASI is at the L level, internal column address strobe signal /CASI is at the H level and internal write enable signal /WEI is at the L level, precharge signal PRE is generated. When the internal control signals /CSI, /RASI, /CASI and /WEI are all at the L level, a mode register set signal MS is generated.

SDRAM 10 further includes a mode register 40 storing address signals A0, A1, . . . , Ai from address buffer 34 in response to the mode register set signal MS from command decoder 38, a column address latch 42 latching column address signals A0, A1, . . . , Ai from address buffer 34, and a row address latch 44 latching row address signals A0, A1, . . . , Ai from address buffer 34. The column address signal CA latched in column address latch 42 is applied to column decoder 16. The row address signal RA latched in row address latch 44 is applied to row decoder 14.

The SDRAM 10 further includes a test mode detector 46 detecting a test mode and generating a test mode signal TEST in response to an externally applied address signal A0 and a signal from mode register 40, a test precharge signal generator 48 activated in response to the test mode signal TEST and generating a test precharge signal TEPRE in response to the write signal W and the internal write enable signal /WEI, and an OR gate 50 generating the precharge signal PRE in response to the precharge signal PRE and the test precharge signal TPRE.

Here, the internal dock signal CLKI from clock buffer 24 is applied to almost all internal circuits such as buffers 26, 28, 30, 32, 34, 36, command decoder 38, address latches 42 and 44 and decoders 14 and 16. Therefore, SDRAM 10 operates in synchronization with the external clock signal CLKE. The activation signal ACT from command decoder 38 is applied to row decoder 14. The write signal W from command decoder 38 is applied to column decoder 16 and input/output circuit 22 as well as to test precharge signal generator 48. The read signal R from command decoder 38 is applied to column decoder 16 and input/output circuit 22. The precharge signal PRE from command decoder 38 is applied to row decoder 14, precharge/equalize circuit 18 and sense amplifier circuit 20 through OR gate 50.

Figure 2:
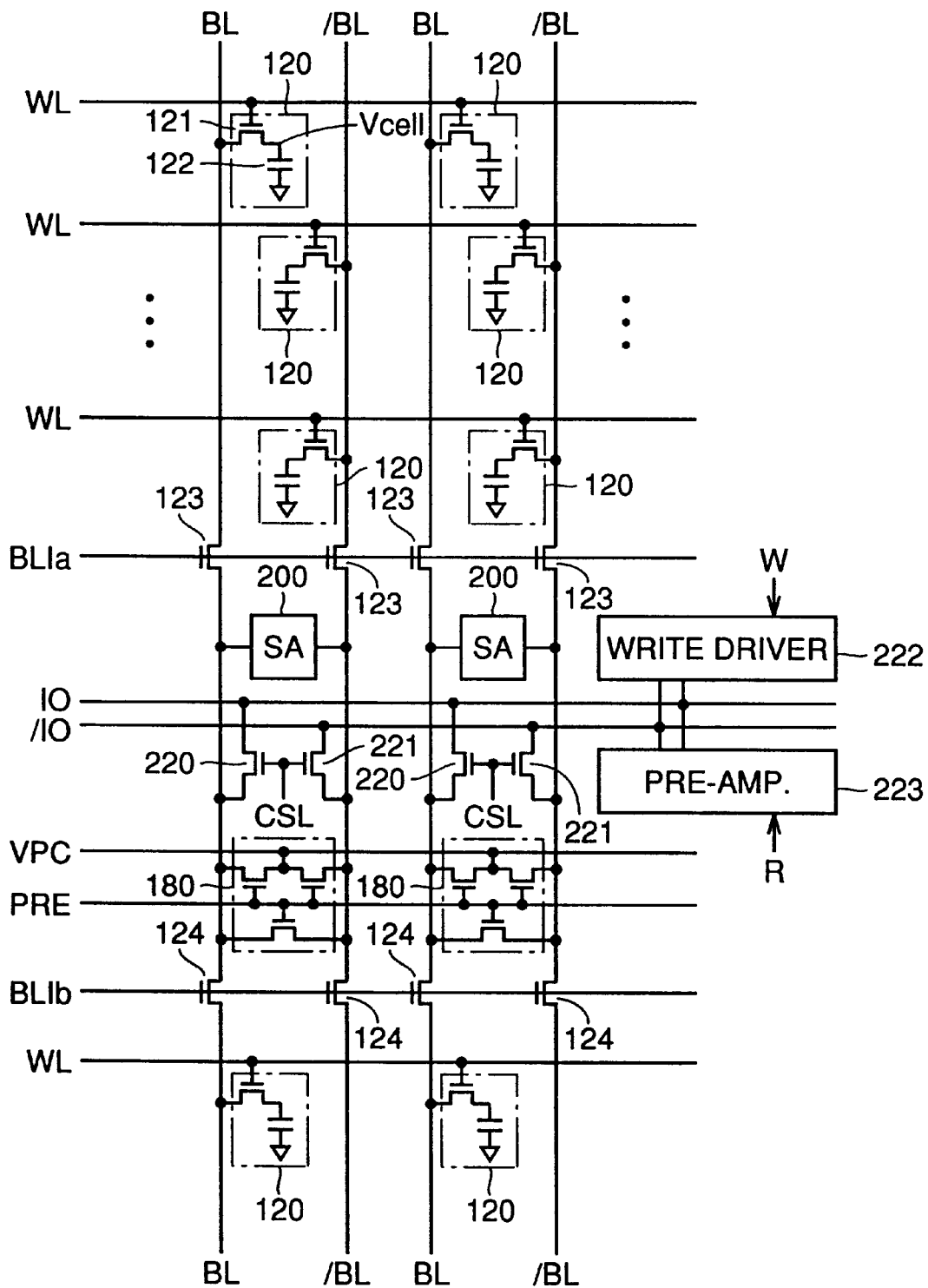
FIG. 2 is a circuit diagram representing specific configuration of the memory cell array, precharge/equalize circuit, sense amplifier circuit and input/output circuit shown in FIG. 1.

Referring to FIG. 2, memory cell array 12 includes a plurality of memory cells 120 arranged in a matrix of rows and columns, a plurality of word lines WL arranged in rows, and a plurality of bit line pairs BL, /BL arranged in columns. Each memory cell 120 is connected to the corresponding word line WL and bit line BL or /BL, and includes an access transistor 121 and a capacitor 122.

Sense amplifier circuit 20 includes a plurality of sense amplifiers 200. Each sense amplifier 200 corresponds to two bit line pairs BL, /BL and is shared by the two bit line pairs BL, /BL. Therefore, each sense amplifier 200 is connected to the bit lines BL and /BL of one pair through isolation transistors 123 and 123, and connected to bit lines BL and /BL of the other pair through isolation transistors 124 and 124. When a voltage higher by threshold voltage of isolation transistor 123 than a power supply voltage is applied to isolation transistors 123 as bit line isolating signal BLIa, the isolation transistors 123 are turned on. When a voltage higher by threshold voltage of isolation transistor 124 than the power supply voltage is applied to isolation transistors 124 as bit line isolating signal BLIb, isolation transistors 124 are turned on.

Precharge/equalize circuit 18 includes a plurality of prechargers/equalizers 180. Each precharger/equalizer 180 supplies a precharge voltage VPC (half the power supply voltage) to the corresponding bit lines BL and /BL in response to a precharge signal PRE, and equalizes voltages of bit lines BL and /BL.

Input/output circuit 22 includes a plurality of columns selecting gates 220, 221, a write driver 222 and a preamplifier 223. Bit line BL is connected through column selection gate 220 to input/output line IO, and bit line /BL is connected to input/output line /IO through column selection gate 221. Gates of column selection gates 220 and 221 are connected to a column selection line CSL. Write driver 222 amplifies data to be written on input/output line pair IO, /IO in response to the write signal W. Preamplifier 223 amplifies read data on input/output line pair IO, /IO in response to the read signal R.

Row decoder 14 selectively activates a word line WL in response to the activation signal ACT from command decoder 38, and inactivates the activated word line WL in response to the precharge signal PRE from command decoder 38. Column decoder 16 selectively activates column selection line CSL in response to the write signal W or read signal R from command decoder 38. Precharge/equalize circuit 18 precharges bit line pair BL, /BL in response to the precharge signal PRE.

Figure 3:
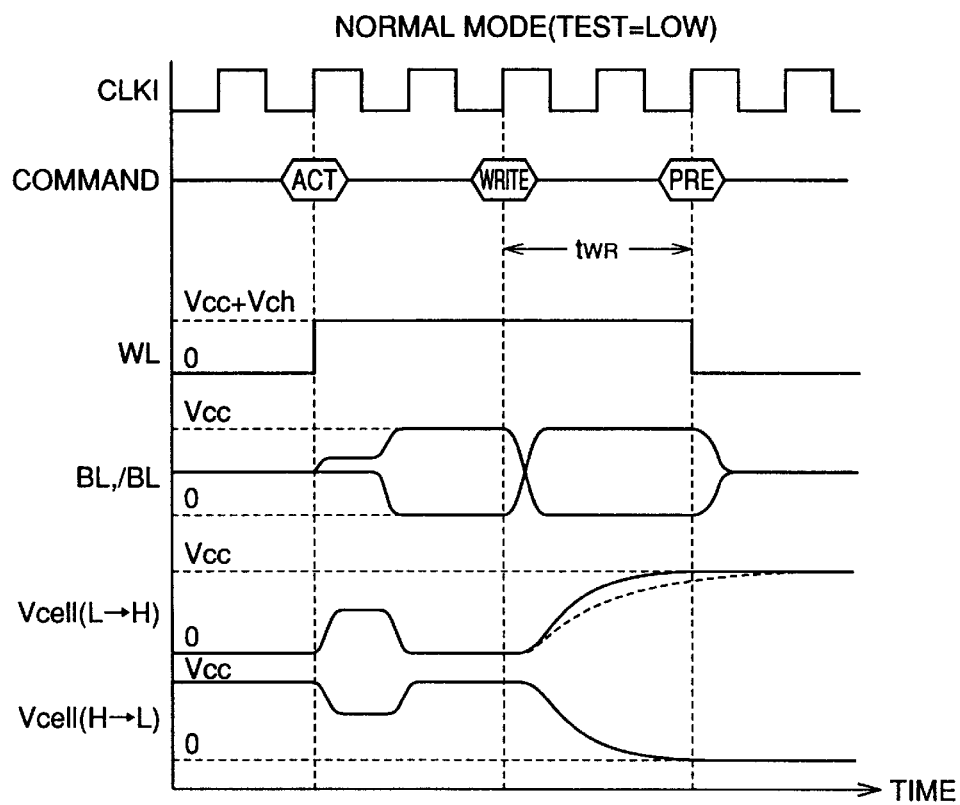
FIG. 3 is a timing chart representing an operation of the SDRAM shown in FIGS. 1 and 2 in the normal mode.

Referring to FIG. 3, when the SDRAM 10 is in the normal mode (when test mode signal TEST is at the L level), the activation command ACT is applied to command decoder 38 in synchronization with internal clock signal CLKI, and the activation signal ACT is applied from command decoder 38 to row decoder 14. In response to the activation signal ACT, row decoder 14 activates a word line WL, and therefore the voltage of word line WL rises to the voltage VCC+Vth, higher than the power supply voltage VCC by the threshold voltage Vth of access transistor 121. When the voltage of the word line WL increases, access transistor 121 connected to the word line WL turns on, and charges which have been stored in capacitor 122 are discharged through access transistor 121 to bit line BL. Thus, the voltage of bit line BL which has been precharged to a precharge voltage VPC (=VCC/2) increases or decreases, in accordance with data which have been stored in the memory cell 120, resulting in potential difference between bit lines BL and /BL. At this time, in the memory cell 120 which has been storing data of L level, cell voltage Vcell of capacitor 122 increases to about VCC/2. On the other hand, in memory cell 120 which has been storing data of H level, cell voltage Vcell lowers to about VCC/2. When sense amplifier 200 is activated thereafter, potential difference generated between bit lines BL and /BL is amplified, whereby the voltage of bit line BL or /BL increases to the power supply voltage VCC while the voltage of bit line /BL or BL lowers to the ground voltage.

When the write command WRITE is applied subsequently, the write signal W is applied to column decoder 16 and input/output circuit 22 from command decoder 38 in synchronization with internal clock signal CLKI. In response to the write signal W, column decoder 16 activates column selection line CSL, and the column selection gates 220 and 221 connected to the activated column selection line CSL are turned on. Thus the data of input/output line pair IO, /IO is transmitted to the bit line pair BL, BL through column selection gates 220 and 221. Write driver 220 is activated in response to the write signal W, and drives input/output line pair IO, /IO. Driving ability of write driver 220 is stronger than that of sense amplifier 200, and when the logic of the data to be written is opposite to the logic of the data read to bit line pair BL, /BL, write driver 220 inverts the voltage of bit lines BL and /BL and also inverts the data latched in sense amplifier 200. Therefore, in the memory cell 120 which has stored L level data, cell voltage Vcell increases toward the power supply voltage VCC, whereas in the memory cell 120 which has stored H level data, the cell voltage Vcell lowers toward the ground voltage.

Thereafter, when precharge command PRE is applied, the precharge signal PRE is applied to row decoder 14, precharge/equalize circuit 18 and sense amplifier circuit 20 through OR gate 50, from command decoder 38, in synchronization with internal clock signal CLKI. Row decoder 14 inactivates the word line WL in response to the precharge signal PRE, whereby the voltage of word line WL lowers to the ground voltage. Therefore, the cell voltage Vcell is maintained at the power supply voltage VCC or the ground voltage. Sense amplifier circuit 20 is inactivated in response to the precharge signal PRE, and precharge/equalize circuit 18 precharges and equalizes bit lines BL and /BL to VCC/2 in response to the precharge signal PRE.

Here, in a memory cell 120 including an access transistor 121 of which impedance is low, the cell voltage Vcell has already reached the power supply voltage VCC by the time when the word line WL is inactivated. In a memory cell 120 having an access transistor 121 of which impedance is high, however, the cell voltage Vcell has not reached the power supply voltage VCC when the word line WL is inactivated. If the cell voltage Vcell is considerably lower than the power supply voltage VCC when the word line WL is inactivated, malfunction such as described above results.

Such malfunction is more likely as the write recovery time $t_{WR}$ from the start of writing operation to the precharging operation becomes shorter. In the SDRAM 10, the external clock signal CLKE having the frequency of about 100 MHz (period of 10 ns) is applied, and therefore, the write recovery time $t_{WR}$ is, at the shortest, about 10 ns. As already described, however, only the external clock signal CLKE of about 20 MHz at the highest can be applied in the wafer test, and hence the write recovery time $t_{WR}$ cannot be made shorter than about 50 ns. Therefore, a memory cell of which power in terms of write recovery time $t_{WR}$ is 10 to 50 ns at the shortest cannot be replaced by a redundant memory cell as a result of wafer test, and hence an SDRAM 10 having such a memory cell 120 would be found defective in the shipment test using the external clock signal CLKE of 100 MHz.

In order to repair such a memory cell 120 having the power of 10 to 50 ns in the wafer test, the SDRAM 10 includes a test precharge signal generator 48 and an OR gate 50, which activate, in the test mode, the precharge signal PRE which is to be applied from command decoder 38 to row decoder 14, precharge/equalize circuit 18 and sense amplifier circuit 20, before generation of the precharge signal PRE by command decoder 38 in response to the write signal W.

Figure 4:
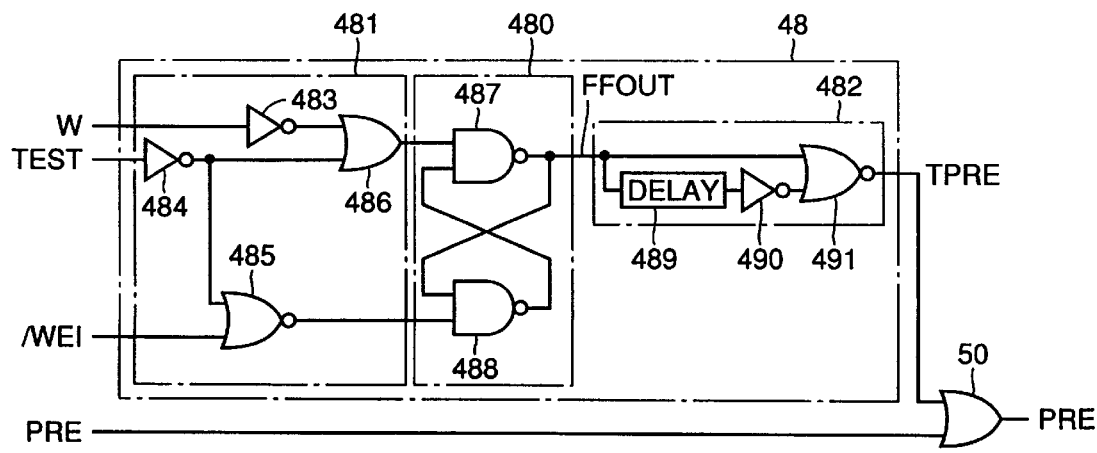
FIG. 4 is a circuit diagram representing a specific configuration of the test precharge signal generator shown in FIG. 1.

Referring to FIG. 4, test precharge signal generator 48 includes: an RS flip-flop 480 set in response to the write signal W and reset in response to the write enable signal /WE; a logic circuit 481 allowing signal input to flip-flop 480 in response to the test mode signal TEST; and a one shot multivibrator 482 generating the test precharge signal TPRE in response to an output signal FFOUT from flip-flop 480. Logic circuit 481 includes inverters 483 and 484, an NOR gate 485 and an OR gate 486. Flip-flop 480 includes NAND gates 487 and 488. One shot multivibrator 482 includes a delay circuit 489, an inverter 490 and an NOR gate 491. Delay circuit 489 includes, for example, a plurality of inverters connected in series.

After a number of such SDRAMs 10 are formed on a wafer and before the wafer is diced and each chip is resin-molded, wafer test is performed. More specifically, a voltage considerably higher than the power supply voltage VCC is applied as an address signal A0, and address signals A0, A1, . . . , Ai representing test of the write recovery time $t_{WR}$ are applied. Further, the mode register set command is applied by using external control signals /CSE, /RASE, /CASE and /WEE. Consequently, the mode register set signal MS is applied from command decoder 38 to mode register 40, and mode register 40 is activated. Accordingly, the applied address signals A0, A1, . . . , Ai are stored in mode register 40 through address buffer 34. Test mode detector 46 generates the test mode signal TEST in response to the signal from mode register 40 and the voltage considerably higher than the power supply voltage VCC applied as address signal A0.

In the normal mode, the test mode signal TEST is at the L level, and therefore the test precharge signal TPRE is fixed at the L level. In the test mode, the test mode signal TEST attains to the H level, and therefore the write signal W is applied through inverter 483 and OR gate 486 to NAND gate 487, and the write enable signal /WEI is applied through NOR gate 485 to NAND gate 488.

Figure 5:
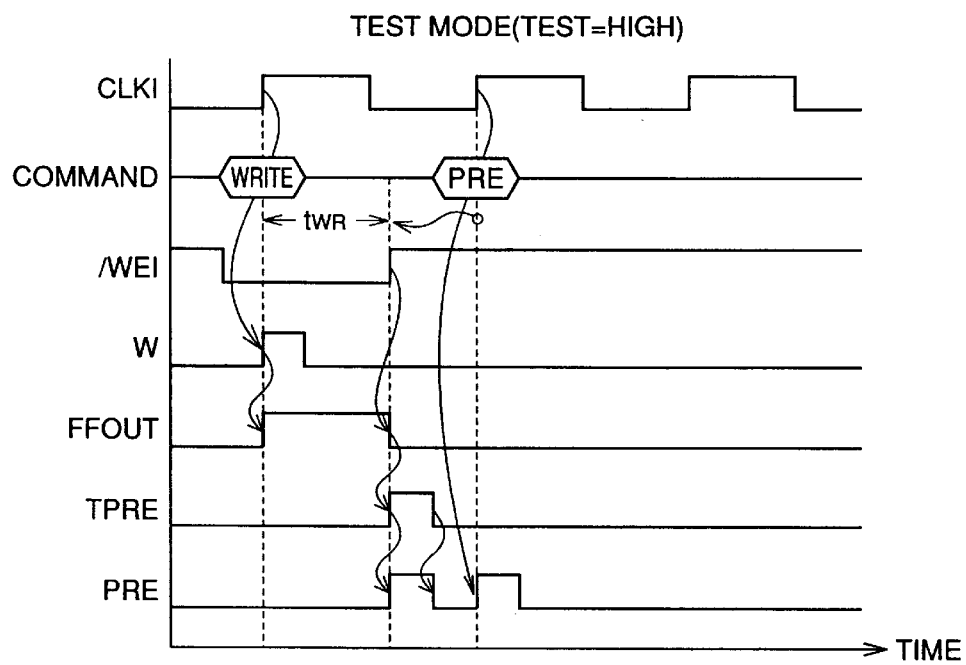
FIG. 5 is a timing chart representing an operation of the SDRAM shown in FIGS. 1, 2 and 4 in the test mode.

Referring to FIG. 5, when the write command WRITE is applied, the internal write enable signal /WEI attains to the L level. Thereafter, the write signal W is generated from command decoder 38 in synchronization with the internal clock signal CLKI. Therefore, flip-flop 480 is set in response to the write signal W which is at the H level, and the output signal FFOUT thereof attains to the H level. When the write enable signal /WEI attains to the H level thereafter, flip-flop 480 is reset in response to the write enable signal /WEI which is at the H level, and output signal FFOUT thereof attains to the L level. In response to the fall of the output signal FFOUT, one shot multivibrator 482 generates the test precharge signal TPRE which is maintained at the H level only for a prescribed time period. As long as the test precharge signal TPRE is at the L level, the precharge signal PRE from command decoder 38 passes the OR gate 50 as it is. When the test precharge signal TPRE attains to the H level, the precharge signal PRE output from OR gate 50 is activated to the H level, even when the precharge signal PRE from command decoder 38 is at the L level. The precharge signal PRE at the H level is applied to row decoder 14, precharge/equalize circuit 18 and sense amplifier circuit 20, and the precharging operation is performed in the similar manner as described above.

Although precharge command PRE is applied in FIG. 5, it is not necessary to externally apply precharge command PRE in the test mode since precharge signal PRE is generated in response to internally generated test precharge signal TPRE instead of externally applied precharge command PRE.

In the test mode, the test precharge signal TPRE is generated asynchronously in response to the rise of write enable signal /WEI, the precharge signal PRE is forced to be activated, before generation of the normal precharge signal PRE in synchronization with the internal clock signal CLKI upon application of the normal precharge command PRE. As a result, even when the wafer test is performed using the clock signal CLKE having the frequency of 20 MHz (period of 50 ns), the write recovery time period $t_{WR}$ can be, in effect, shortened. As a result, a memory cell 120 which is defective when the write recovery time period $t_{WR}$ is 10 to 50 ns can be replaced by the redundant memory cell as a result of the wafer test, and therefore production yield of the SDRAM 10 can be improved.

Second Embodiment

Figure 6:
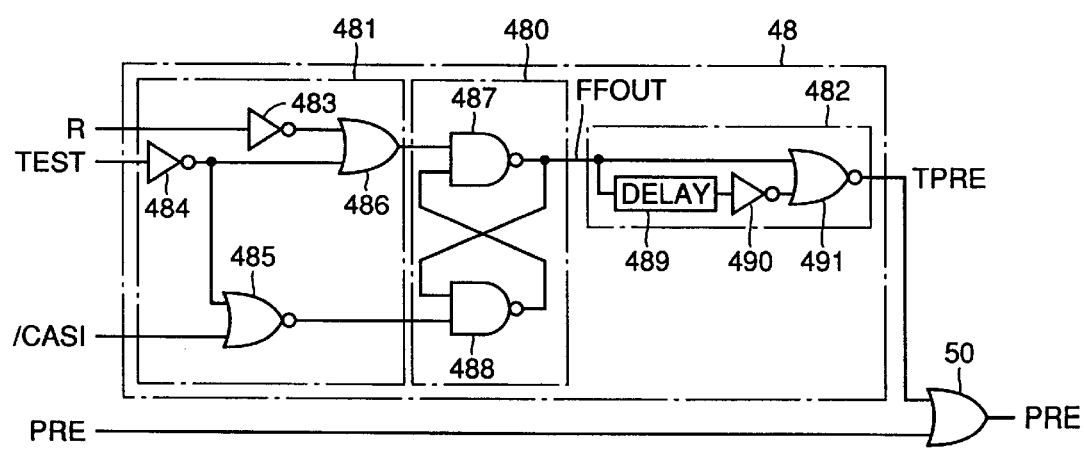
FIG. 6 is a circuit diagram representing another configuration of the test precharge signal generator shown in FIG. 1.

Referring to FIG. 6, to test precharge signal generator 48, the read signal R may be applied in place of the write signal W, and the internal column address strobe signal /CASI may be applied in place of the internal write enable signal /WEI.

Figure 7:
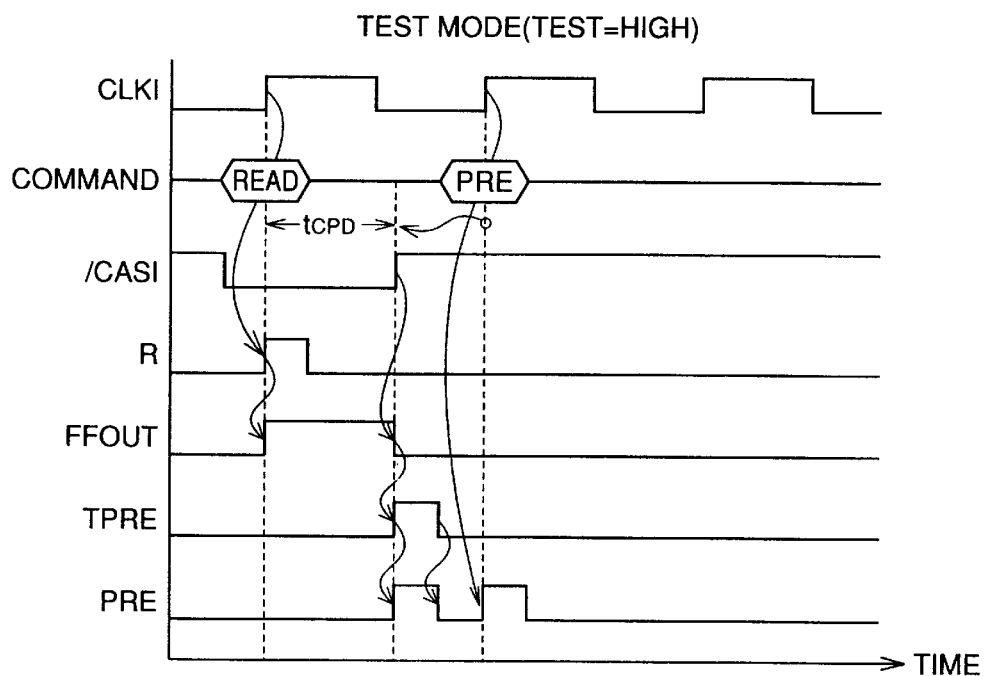
FIG. 7 is a timing chart representing an operation of the test precharge signal generator shown in FIG. 6.

Referring to FIG. 7, when the read command READ is applied, similar to the operation when the write signal W is applied, a one shot pulse read signal R is generated by command decoder 38, and in response to the read signal R, column decoder 16 and input/output circuit 22 execute a reading operation. Thereafter, when internal column address strobe signal /CASI rises to the H level, the test precharge signal TPRE is generated in the similar manner as described above. Therefore, after the input of the read command READ and before the input of the precharge command PRE, the precharging operation takes place. As a result, it becomes possible to perform the wafer test with the time period $T_{CPD}$ from the start of reading operation to the precharging operation shortened.

Third Embodiment

Figure 8:
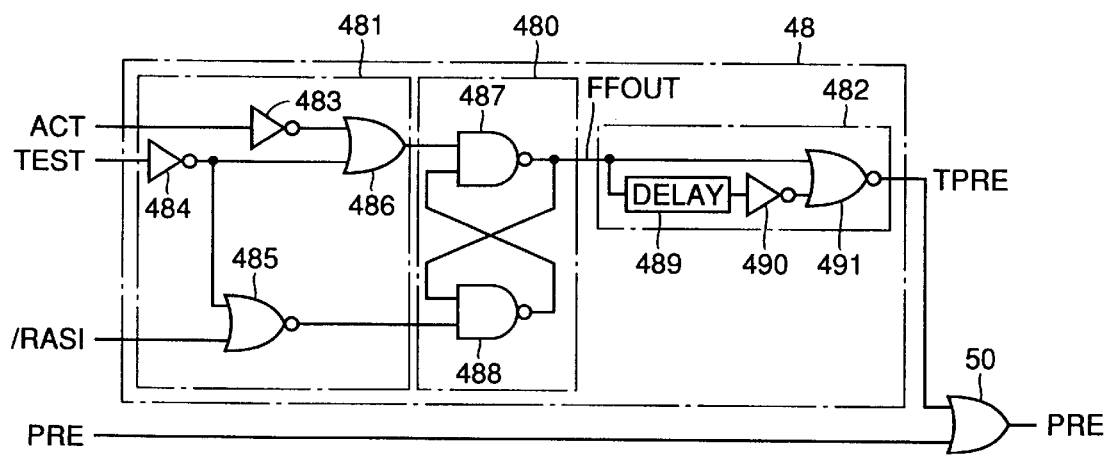
FIG. 8 is a circuit diagram showing a still further configuration of the test precharge signal generator shown in FIG. 1.

Referring to FIG. 8, to test precharge signal generator 48, the activation signal ACT may be applied in place of the write signal W or the read signal R, and the internal row address strobe signal /RASI may be applied in place of the write enable signal /WEI or the internal column address strobe signal /CASI.

Referring to FIG. 9, when the activation command ACTIVATE is applied, a one shot pulse activation signal ACT is generated similar to write signal W or read signal R, by command decoder 38. When the internal row address strobe signal /RASI rises to the H level, the test precharge signal TPRE is generated in the similar manner as described above. Therefore, after the input of the activation command ACTIVATE and before the input of the precharge command PRE, the precharging operation takes place. As a result, it becomes possible to perform the wafer test while the time period $t_{RAS}$ from the start of activating operation to the precharging operation is shortened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a normal mode and a test mode, comprising:

a memory cell array;

a command decoder decoding a first command comprising a first combination of a plurality of external signals and a second command comprising a second combination of said plurality of external signals and applied after said first command, and generating first and second command signals, respectively;

an operation circuit coupled to said memory cell array and executing the first and second command operations in response to said first and second command signals; and an early activation circuit coupled to said command decoder and said operation circuit, and activating said second command signal which is to be applied from said command decoder to said operation circuit, before generation of said second command signal by said command decoder, in response to said first command signal in said test mode.

2. The semiconductor memory device according to claim 1, wherein said second command is a precharge command, said second command signal is a precharge signal and said second command operation is a precharging operation.

3. The semiconductor memory device according to claim 2, wherein said operation circuit includes a data write circuit writing data to said memory cell array, said first command is a write command, said first command signal is a write signal, and said first command operation is a write operation.

4. The semiconductor memory device according to claim 3, wherein said external signal includes a write enable signal, and said early activation circuit activates said precharge signal in response to inactivation of said write enable signal.

5. The semiconductor memory device according to claim 2, wherein said operation circuit includes a data read circuit reading data from said memory cell array, said first command is a read command, said first command signal is a read signal and said first command operation is a read operation.

6. The semiconductor memory device according to claim 5, wherein said external signal includes a column address strobe signal, and said early activation circuit activates said precharge signal in response to inactivation of said column address strobe signal.

7. The semiconductor memory device according to claim 2, wherein said first command is an activation command, said fist command signal is an activation signal and said first command operation is an activating operation.

8. The semiconductor memory device according to claim 7, wherein said external signal includes a row address strobe signal, and said early activation circuit activates said precharge signal in response to inactivation of said row address strobe signal.

9. The semiconductor memory device according to claim 2, further comprising a test mode detecting circuit detecting said test mode and generating a test mode signal for activating said early activation circuit, in response to an externally applied signal.

10. The semiconductor memory device according to claim 9, wherein said early activation circuit includes a flip-flop set in response to said first command signal and reset in response to one of said external signals, a logic circuit allowing signal input to said flip-flop in response to said test mode signal, a one shot multivibrator generating a test precharge signal in response to an output signal of said flip-flop, and a logic gate activating said precharge signal in response to said test precharge signal.

11. The semiconductor memory device according to claim 1, wherein said semiconductor memory device is a synchronous dynamic random access memory device operating in synchronization with an externally applied clock signal.

* * * * *